United States Patent
Wang et al.

(10) Patent No.: US 11,435,391 B2
(45) Date of Patent: Sep. 6, 2022

(54) DUAL-SIDED WAFER IMAGING APPARATUS AND METHODS THEREOF

(71) Applicant: NANYA TECHNOLOGY CORPORATION, New Taipei (TW)

(72) Inventors: Ying-Chuan Wang, Taoyuan (TW); Yi-Wen Liu, Taoyuan (TW); Shih-Chih Lin, New Taipei (TW); Jih-Cheng Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/748,823

(22) Filed: Jan. 22, 2020

(65) Prior Publication Data

US 2021/0223308 A1 Jul. 22, 2021

(51) Int. Cl.
| | |
|---|---|
| *G01R 31/265* | (2006.01) |
| *G01R 31/28* | (2006.01) |
| *G06T 7/00* | (2017.01) |
| *H04N 5/225* | (2006.01) |

(52) U.S. Cl.
CPC ..... *G01R 31/2656* (2013.01); *G01R 31/2808* (2013.01); *G06T 7/0006* (2013.01); *H04N 5/2254* (2013.01); *G06T 2207/20081* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 9,778,192 | B2 * | 10/2017 | Wouters | G01N 21/958 |
| 2008/0316504 | A1 | 12/2008 | Nemets et al. | |
| 2017/0213333 | A1 * | 7/2017 | Kang | G06T 7/0004 |
| 2018/0358271 | A1 | 12/2018 | David | |

(Continued)

FOREIGN PATENT DOCUMENTS

| | | | | |
|---|---|---|---|---|
| DE | 102020207902 | A1 * | 12/2020 | B28D 5/0058 |
| TW | 201508858 | A | 3/2015 | |

(Continued)

OTHER PUBLICATIONS

Notice of Allowance dated Mar. 7, 2022 related to Taiwanese Application No. 111101950.

*Primary Examiner* — Chikaodili E Anyikire
(74) *Attorney, Agent, or Firm* — Xuan Zhang

(57) ABSTRACT

The present disclosure provides a dual-sided wafer imaging apparatus and methods thereof. The dual-sided wafer imaging apparatus includes one or more load ports, one or more mechanical arms for transporting a wafer, a wafer transfer stage, a first line scan camera mounted below the wafer transfer stage, a second line scan camera mounted above the wafer transfer stage, a first optical lens mounted on the first line scan camera, a second optical lens mounted on the second line scan camera, and line light sources respectively mounted below and above the wafer transfer stage. The load ports are configured for an automated load operation or unload operation of a wafer pod of an automated transport equipment. The wafer transfer stage includes vacuum suction points in contact with a backside of the wafer, and the wafer transfer stage further includes a drive motor producing a linear reciprocating motion for moving the wafer.

17 Claims, 6 Drawing Sheets

(56) References Cited

U.S. PATENT DOCUMENTS

| | | | |
|---|---|---|---|
| 2019/0035696 A1* | 1/2019 | Lin | H01L 21/67288 |
| 2020/0234428 A1* | 7/2020 | George | G06N 3/0454 |
| 2022/0059415 A1* | 2/2022 | Lin | H05K 13/08 |

FOREIGN PATENT DOCUMENTS

| | | |
|---|---|---|
| TW | 201932827 A | 8/2019 |
| TW | 201944509 A | 11/2019 |

* cited by examiner

DUAL-SIDED WAFER IMAGING APPARATUS AND METHODS THEREOF

TECHNICAL FIELD

The present disclosure relates to an imaging apparatus, and more particularly, to a dual-sided wafer imaging apparatus and methods thereof.

DISCUSSION OF THE BACKGROUND

The semiconductor industry has experienced continued rapid growth due in part to improvements in manufacturing processes and device integration. During the manufacture of semiconductor devices, wafers often become damaged due to foreign particle contamination or other pollution or area defects on the wafers. Human inspection for such defects is costly, time-consuming, and non-uniform. Moreover, backside wafer images may be occluded by various contact points and particles. Therefore, it is crucial to optimize the dual-sided wafer imaging and inspection processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a dual-sided wafer imaging apparatus, comprising one or more load ports, one or more mechanical arms for transporting a wafer, a wafer transfer stage, a first line scan camera mounted below the wafer transfer stage, a second line scan camera mounted above the wafer transfer stage, a first optical lens mounted on the first line scan camera, a second optical lens mounted on the second line scan camera, and two or more line light sources respectively mounted below and above the wafer transfer stage. The one or more load ports are configured for an automated load operation or unload operation of a wafer pod of an automated transport equipment. The wafer transfer stage comprises three or more vacuum suction points in contact with a backside of the wafer, and the wafer transfer stage further comprises a drive motor producing a linear reciprocating motion for moving the wafer.

In some embodiments, the two or more line light sources output a yellow light or a white light.

In some embodiments, the dual-sided wafer imaging apparatus further comprises one or more wafer aligners for adjusting a position and a rotation angle of the wafer, returning the wafer to an origin point, and reading a label.

In some embodiments, the dual-sided wafer imaging apparatus further comprises an air injection device comprising a first nozzle aligned with the first optical lens of the first line scan camera.

In some embodiments, the air injection device further comprises a second nozzle aligned with the second optical lens of the second line scan camera.

In some embodiments, the air injection device injects an air stream to prevent particles from adhering to the first optical lens and the second optical lens.

In some embodiments, the air injection device injects the air stream when the wafer is not being imaged by the dual-sided wafer imaging apparatus.

Another aspect of the present disclosure provides a method for dual-sided imaging of a wafer, comprising capturing a dual-sided image of the wafer, wherein when the wafer is transferred in an outbound trip by a wafer transfer stage, a first line scan camera and a second line scan camera respectively mounted below and above the wafer transfer stage respectively capture a first backside wafer image and a frontside wafer image of the dual-sided image of the wafer; rotating the wafer by a predetermined angle, wherein when the wafer reaches an end point of the outbound trip, a wafer aligner below the wafer rises along a vertical direction to pick up the wafer, rotate the wafer by the predetermined angle, and return the wafer to the wafer transfer stage; capturing a second backside wafer image, wherein when the wafer is transferred in a return trip by the wafer transfer stage, the first line scan camera below the wafer transfer stage captures the second backside wafer image; and performing an image processing operation, wherein one or more regions occluded by one or more contact points in the first backside wafer image are imaged more clearly by replacing the first backside wafer image with the second backside wafer image.

In some embodiments, two or more line light sources are respectively mounted below and above the wafer transfer stage, and the two or more line light sources output a yellow light or a white light.

In some embodiments, an air injection device comprising a first nozzle is aligned with a first optical lens of the first line scan camera.

In some embodiments, the air injection device further comprises a second nozzle aligned with a second optical lens of the second line scan camera.

In some embodiments, the air injection device injects an air stream to prevent particles from adhering to the first optical lens and the second optical lens.

In some embodiments, the air injection device injects the air stream when the wafer is not being imaged.

Another aspect of the present disclosure provides a method for dual-sided defect inspection and classification of a wafer, comprising: capturing a backside wafer image and a frontside wafer image; determining whether a deep learning object detection model is available; when the deep learning object detection model is available, feeding each image to be inspected into the deep learning object detection model and outputting a plurality of output data, wherein each output data comprises a predicted probability, a predicted classification, and a predicted frame position of a defect in the image; filtering out data having a predicted probability lower than a preset threshold value; selecting, by using a non-maximum suppression algorithm, an optimal predicted frame from a plurality of predicted frames having an intersection over union greater than the preset threshold value; calculating a defect characteristic value according to the predicted classification and the predicted frame position; and outputting an inspection result of the frontside wafer image and the backside wafer image.

In some embodiments, the method further comprises: when the deep learning object detection model is not available, labeling a plurality of wafer images as a training data and marking a position and a classification of each defect in the wafer images, wherein the defect position is represented by a square frame surrounding the defect, and image coordinates of the upper left and bottom right vertices of the square frame are recorded; and training the deep learning object detection model, wherein a predetermined quantity of the training data is used to train the deep learning object detection model.

In some embodiments, a first line scan camera and a second line scan camera respectively mounted below and above a wafer transfer stage respectively capture the backside wafer image and the frontside wafer image, two or more line light sources are respectively mounted below and above the wafer transfer stage, and the two or more line light sources output a yellow light or a white light.

In some embodiments, an air injection device comprising a first nozzle is aligned with a first optical lens of the first line scan camera.

In some embodiments, the air injection device further comprises a second nozzle aligned with a second optical lens of the second line scan camera.

In some embodiments, the air injection device injects an air stream to prevent particles from adhering to the first optical lens and the second optical lens.

In some embodiments, the air injection device injects the air stream when the wafer is not being imaged.

Accordingly, due to the dual-sided wafer imaging apparatus and the dual-sided wafer imaging and inspection methods of the present disclosure, errors and costs due to human inspection can be reduced significantly. Moreover, non-occluded backside wafer images can be obtained by automated processes with great accuracy. The dual-sided wafer imaging apparatus and the dual-sided imaging and inspection methods also allow the defect data to be collected and analyzed quickly by artificial intelligence algorithms when compared to human inspection.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
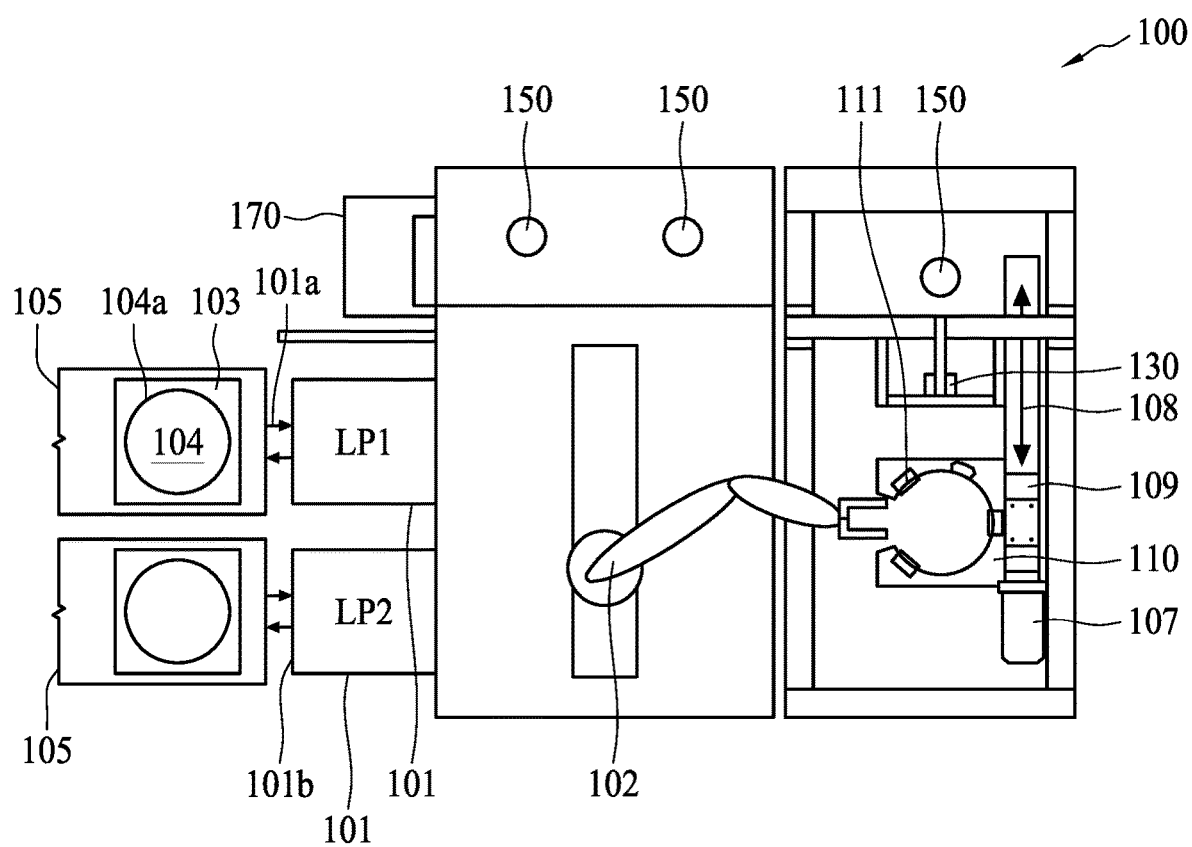
FIG. 1 is a schematic diagram of a dual-sided wafer imaging apparatus according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2A:
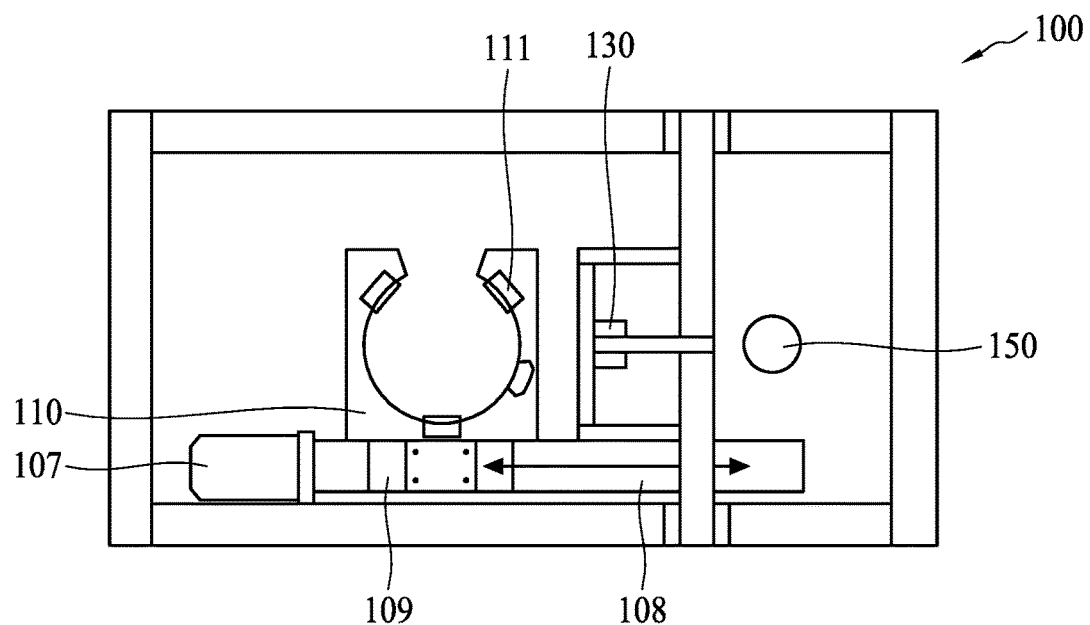
FIG. 2A is a partial top view of a dual-sided wafer imaging apparatus according to some embodiments of the present disclosure.
Figure 2B:
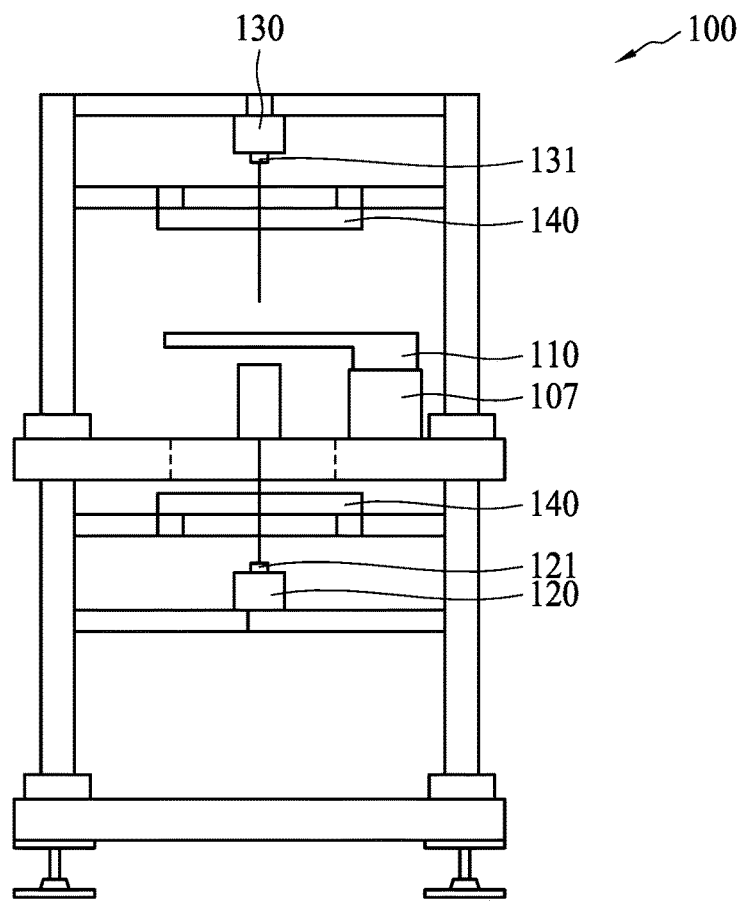
FIG. 2B is a partial back view of a dual-sided wafer imaging apparatus according to some embodiments of the present disclosure.
Figure 2C:
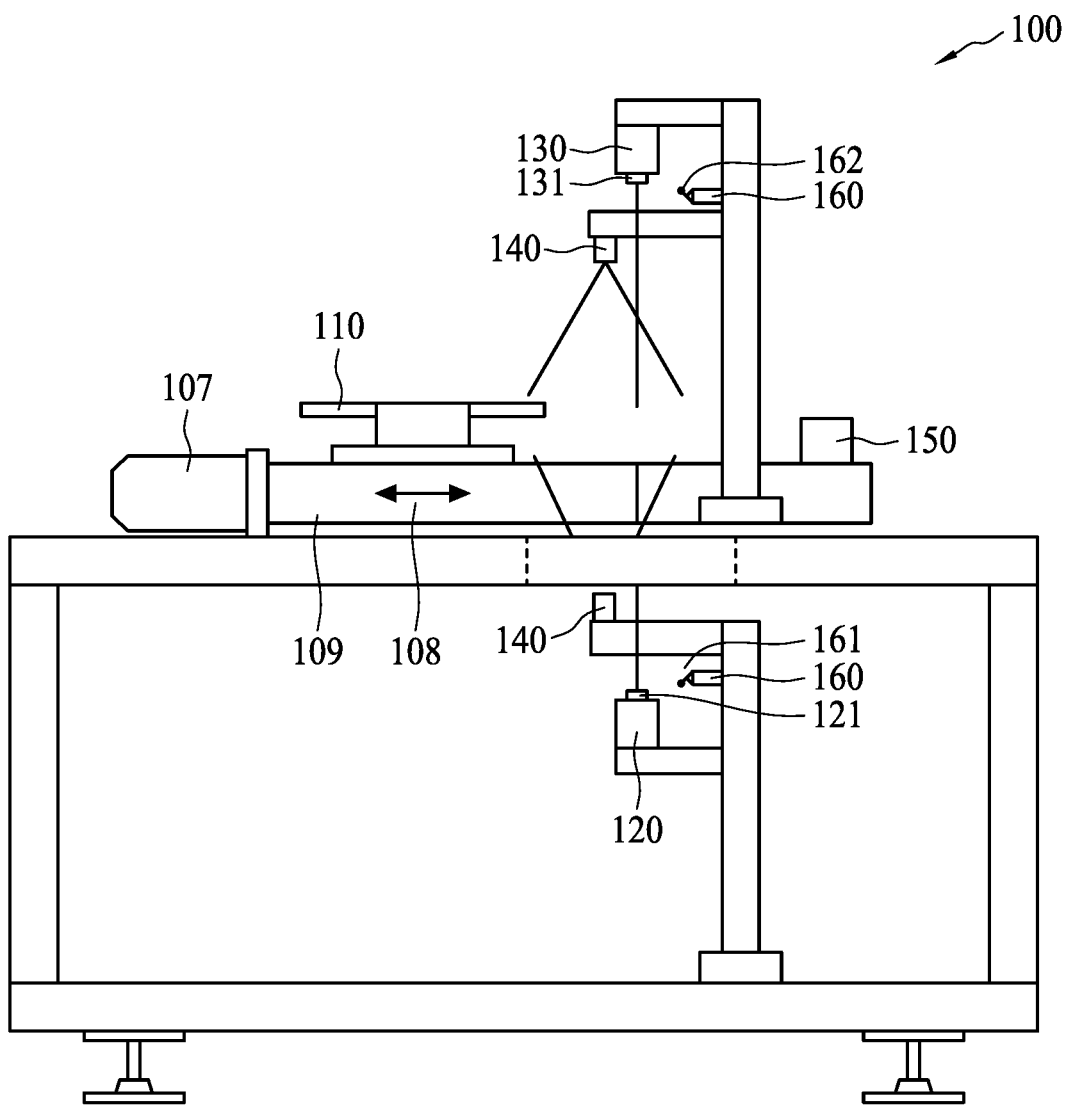
FIG. 2C is a partial side view of a dual-sided wafer imaging apparatus 100 according to some embodiments of the present disclosure.

FIG. 1 is a schematic diagram of a dual-sided wafer imaging apparatus 100 according to some embodiments of the present disclosure. FIG. 2A is a partial top view of the dual-sided wafer imaging apparatus 100, FIG. 2B is a partial back view of the dual-sided wafer imaging apparatus 100, and FIG. 2C is a partial side view of the dual-sided wafer imaging apparatus 100 according to some embodiments of the present disclosure. With reference to FIG. 1 and FIG. 2A to FIG. 2C, the dual-sided wafer imaging apparatus 100 includes one or more load ports 101, one or more mechanical arms 102, a wafer transfer stage 110, a first line scan camera 120 mounted below the wafer transfer stage 110, a second line scan camera 130 mounted above the wafer transfer stage 110, a first optical lens 121 mounted on the first line scan camera 120, a second optical lens 131 mounted on the second line scan camera 130, and two or more line light sources 140 mounted respectively below and above the wafer transfer stage 110.

In some embodiments, the load ports 101 are configured for an automated load operation 101*a* or unload operation 101*b* of a wafer pod 103 of an automated transport equipment 105. The mechanical arm 102 is configured for transporting a wafer 104 to various predefined locations in the dual-sided wafer imaging apparatus 100. In some embodiments, the wafer transfer stage 110 includes three or more vacuum suction points 111 in contact with a backside 104a of the wafer 104. The wafer transfer stage 110 further includes a drive motor 107 producing a linear reciprocating motion 108 for moving the wafer 104 across a slide stage 109.

In some embodiments, the two or more line light sources 140 shown in FIG. 2B and FIG. 2C may output a yellow light or a white light. In some embodiments, the dual-sided wafer imaging apparatus 100 further includes one or more wafer aligners 150 configured for adjusting a position and a rotation angle of the wafer 104, returning the wafer 104 to an origin point, and reading a label. In some embodiments, the dual-sided wafer imaging apparatus 100 further includes a processing device 170. The processing device 170 may be used for executing the algorithms and instructions of a plurality of imaging and defect analysis methods and processes of the dual-sided wafer imaging apparatus 100, and these methods will be described later in the present disclosure.

In some embodiments, the dual-sided wafer imaging apparatus 100 may further include an air injection device 160, as shown in FIG. 2C. The air injection device 160 includes a first nozzle 161 aligned with the first optical lens 121 of the first line scan camera 120. In some embodiments, the air injection device 160 may further include a second nozzle 162 aligned with the second optical lens 131 of the second line scan camera 130. In some embodiments, the air injection device 160 may inject an air stream of suitable pressure to prevent particles from adhering to the first optical lens 121 and the second optical lens 131 of the line scan cameras 120 and 130. In some embodiments, the air injection device 160 injects the air stream when the wafer 104 is not being imaged by the dual-sided wafer imaging apparatus 100.

Figure 3:
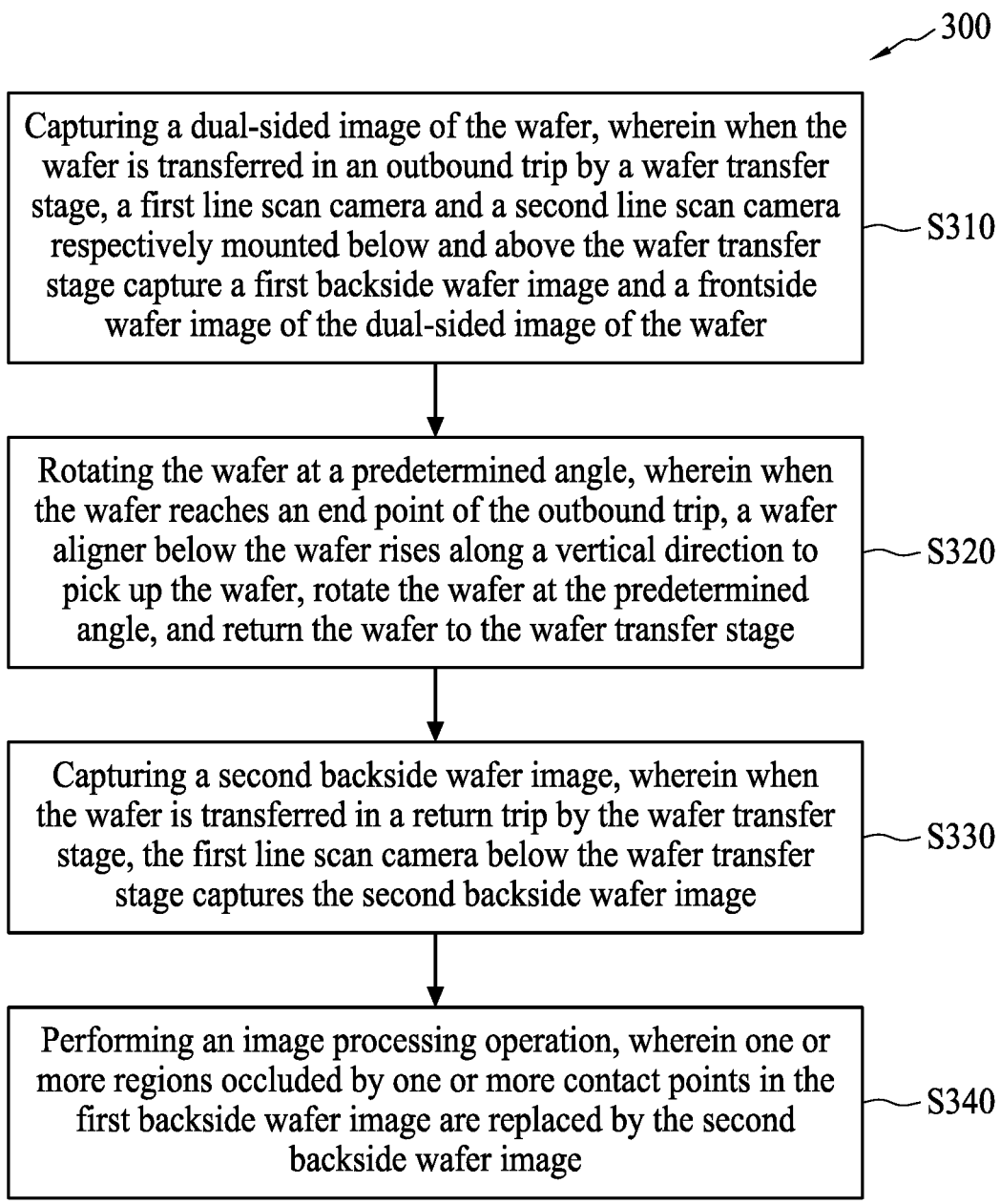
FIG. 3 is a flow diagram of a method for dual-sided imaging of a wafer according to some embodiments of the present disclosure.

In some embodiments, a method for dual-sided imaging of a wafer may be provided with the dual-sided wafer imaging apparatus 100 depicted in FIG. 1 and FIG. 2A to FIG. 2C. FIG. 3 is a flow diagram of a method 300 for dual-sided imaging of the wafer 104 according to some embodiments of the present disclosure. With reference to FIG. 3, the method 300 includes, in Step S310, capturing a dual-sided image of the wafer 104. When the wafer 104 is transferred in an outbound trip by a wafer transfer stage 110, a first line scan camera 120 and a second line scan camera 130 respectively mounted below and above the wafer transfer stage respectively capture 110 a first backside wafer image and a frontside wafer image of the dual-sided image of the wafer 104. In Step S320, the wafer 104 is rotated by a predetermined angle. When the wafer 104 reaches an end point of the outbound trip, the wafer aligner 150 below the wafer 104 rises along a vertical direction to pick up the wafer 104, rotate the wafer 104 by the predetermined angle, and return the wafer 104 to the wafer transfer stage 110. In Step S330, a second backside wafer image is captured. When the wafer 104 is transferred in a return trip by the wafer transfer stage 110, the first line scan camera 120 below the wafer transfer stage 110 captures the second backside wafer image. In Step S340, an image processing operation is performed, in which one or more regions occluded by one or more contact points in the first backside wafer image are imaged more clearly by replacing the first backside wafer image with the second backside wafer image.

In some embodiments of the method 300, the two or more line light sources 140 are respectively mounted below and above the wafer transfer stage 110, and the two or more line light sources 140 output a yellow light or a white light.

In some embodiments of the method 300, the air injection device 160 including the first nozzle 161 is aligned with the first optical lens 121 of the first line scan camera 120. In some embodiments of the method 300, the air injection device 160 further includes a second nozzle 162 aligned with the second optical lens 131 of the second line scan camera 130. In some embodiments of the method 300, the air injection device 160 injects an air stream of suitable pressure to prevent particles from adhering to the first optical lens 121 and the second optical lens 131. In some embodiments of the method 300, the air injection device 160 injects the air stream when the wafer 104 is not being imaged.

Figure 4:
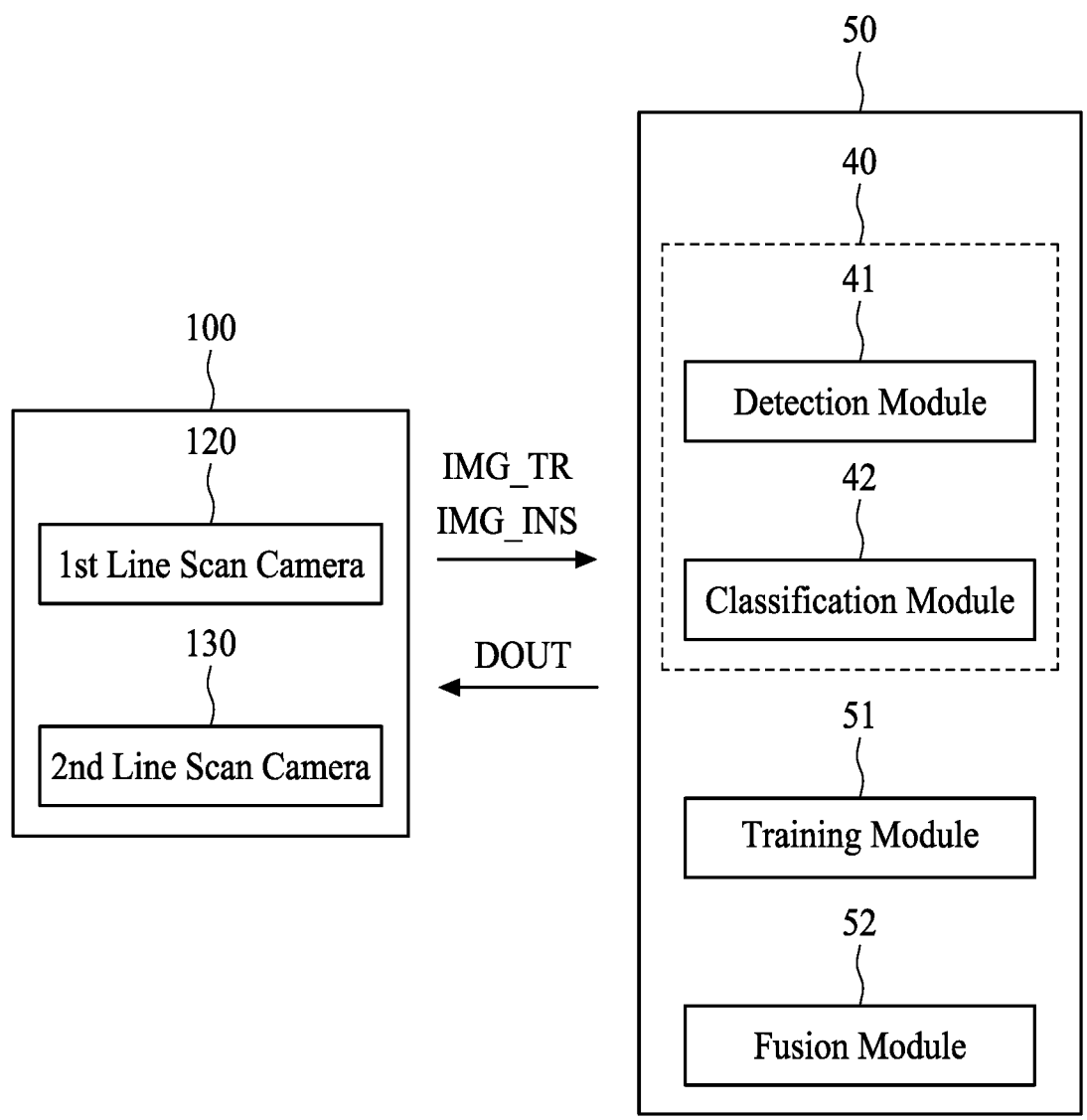
FIG. 4 is a block diagram of a deep learning object detection model according to some embodiments of the present disclosure.
Figure 5:
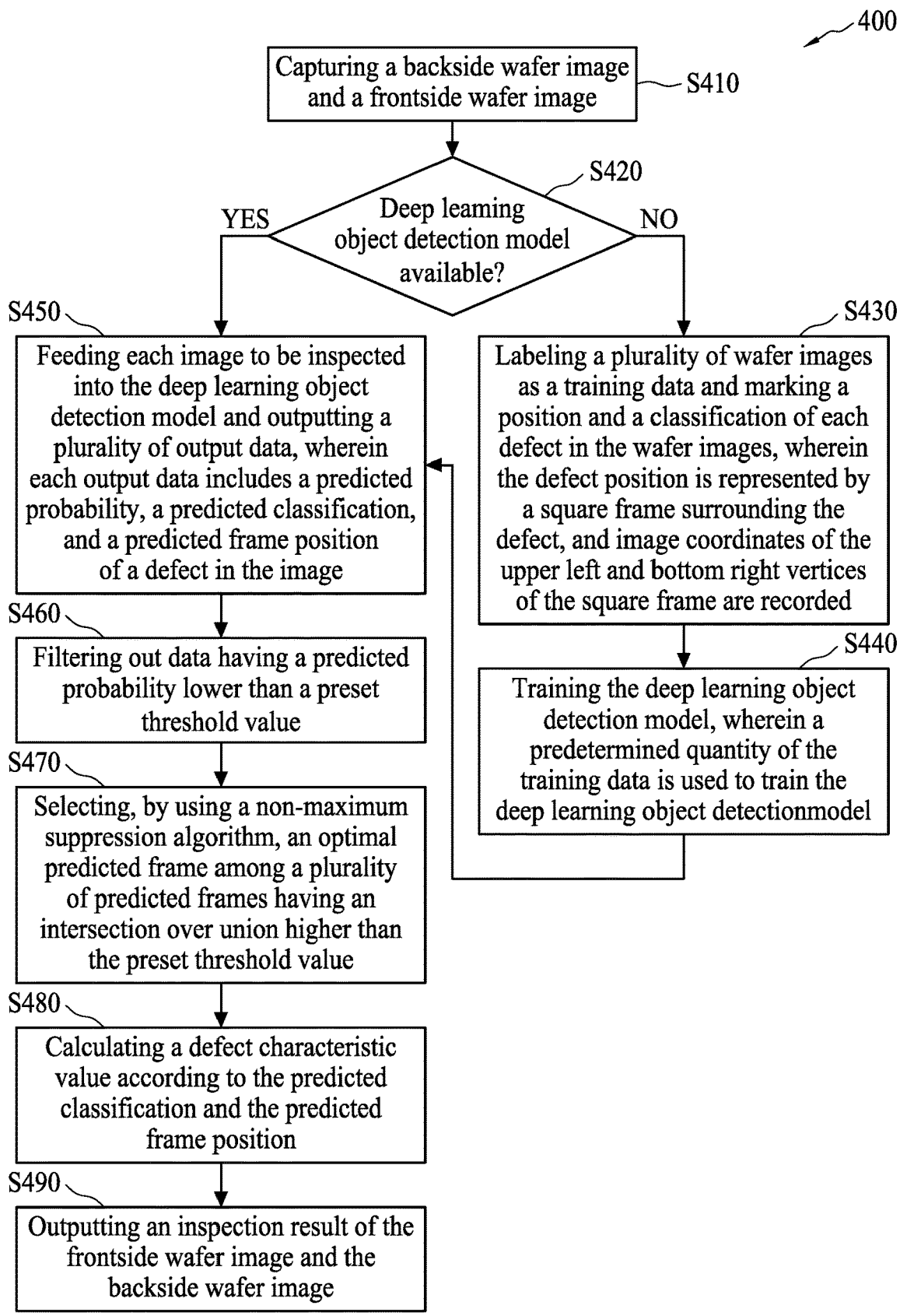
FIG. 5 is a flow diagram of a method for dual-sided defect inspection and classification of a wafer according to some embodiments of the present disclosure.

In some embodiments, a method for dual-sided defect inspection and classification of a wafer may also be provided with the dual-sided wafer imaging apparatus 100 depicted in FIG. 1 and FIG. 2A to FIG. 2C. FIG. 4 is a block diagram of a deep learning object detection system 50 according to some embodiments of the present disclosure. FIG. 5 is a flow diagram of a method 400 for dual-sided defect inspection and classification of the wafer 104 according to some embodiments of the present disclosure. With reference to FIG. 4 and FIG. 5, the deep learning object detection system 50 may be used for the method 400 for dual-sided defect inspection and classification of the wafer 104. The deep learning object detection system 50 includes a deep learning object detection model 40, a classification module 51, and a fusion module 52. The deep learning object detection model 40 may include a detection module 41 and a classification module 42. In some embodiments, other components may also be included in the deep learning object detection system 50 if suitable for the particular application. The method 400 includes, in Step S410, capturing a backside wafer image and a frontside wafer image by using, for example, the first line scan camera 120 and the second line scan camera 130 of the dual-sided wafer imaging apparatus 100. In Step S420, whether a deep learning object detection model 40 is available is determined. When the deep learning object detection model 40 is not available, in Step S430, a plurality of wafer images are labeled as a training data IMG_TR and a position and a classification of each defect in the wafer images are marked. The defect position is represented by a square frame surrounding the defect, and image coordinates of the upper left and bottom right vertices of the square frame are recorded. In Step S440, the deep learning object detection model 40 is trained, for instance in the training module 51 of the deep learning object detection model system 50, in which a predetermined quantity of the training data IMG_TR is used to train the deep learning object detection model 40. When the deep learning object detection model 40 is available, in Step S450, each image to be inspected IMG_INS is fed into the deep learning object detection model 40 and a plurality of output data DOUT are outputted. Each output data DOUT includes a predicted probability, a predicted classification, and a predicted frame position of a defect in the image. In some embodiments, the output data DOUT may be obtained by using the detection module 41, the classification module 42, and the fusion module 52 of the deep learning object detection system 50. In Step S460, data having a predicted probability lower than a preset threshold value is filtered out. In Step S470, by using a non-maximum suppression algorithm, an optimal predicted frame is selected from a plurality of predicted frames having an intersection over union greater than the preset threshold value. In Step S480, a defect characteristic value is calculated according to the predicted classification and the predicted frame position. In Step S490, an inspection result of the frontside wafer image and the backside wafer image is outputted.

In some embodiments of the method 400, the first line scan camera 120 and the second line scan camera 130 respectively mounted below and above a wafer transfer stage 110 respectively capture the backside wafer image and the frontside wafer image, two or more line light sources 140 are respectively mounted below and above the wafer transfer stage 110, and the two or more line light sources 140 output a yellow light or a white light.

In some embodiments of the method 400, an air injection device 160 including a first nozzle 161 is aligned with a first optical lens 121 of a first line scan camera 120. In some embodiments of the method 400, the air injection device 160 further includes a second nozzle 162 aligned with a second optical lens 131 of a second line scan camera 130. In some embodiments of the method 400, the air injection device 160 injects an air stream of suitable pressure to prevent particles from adhering to the first optical lens 121 and the second optical lens 131. In some embodiments of the method 400, the air injection device 160 injects the air stream when a wafer 104 is not being imaged.

It should be noted that the processing device 170 of the dual-sided wafer imaging apparatus 100 depicted in FIG. 1 may be used to execute the operations, functionalities, algorithms, and instructions of the dual-sided wafer imaging apparatus 100, the method 300, and the method 400. The processing device 170 may include a processor, a memory, a network interface, a storage device, and an input/output (I/O) device communicatively coupled via a bus or other interconnection communication mechanism (not shown). The memory may include, in some embodiments, a random access memory (RAM), other dynamic storage device, read-only memory (ROM), or other static storage device coupled to the bus for storing data or instructions to be executed by the processor. The memory may also be used, in some embodiments, for storing temporary variables or other intermediate information during execution of instructions to be executed by the processor. In some embodiments, a storage device (not shown), such as a magnetic disk or optical disk, is coupled to the bus for storing data or instructions. The I/O device may include an input device, an output device, or a combined input/output device for enabling user interaction with the dual-sided wafer imaging apparatus 100. An input device includes, for example, a keyboard, keypad, mouse, trackball, trackpad, or cursor direction keys for communicating information and commands to the processor. An output device includes, for example, a display, a printer, or a voice synthesizer for communicating information to a user.

In some embodiments, one or more operations or functionalities of the apparatuses and methods described with respect to FIGS. 1 to 5 may be realized by the processor of the processing device 170, which is programmed for performing such operations and functionality. One or more of the memory, the network interface, the storage device, the I/O device, the hardware components, and the bus are operable to receive instructions, data, design rules, netlists, layouts, models and other parameters for processing by the processor of the processing device 170.

In some embodiments, one or more of the operations or functionalities of the apparatuses and methods described with respect to FIGS. 1 to 5 may be implemented by specifically configured hardware (e.g., by one or more application specific integrated circuits (ASICs)) separate from or in lieu of the processor of the processing device 170. Some embodiments may incorporate more than one of the described operations or functionalities in a single ASIC. In some embodiments, the operations and functionalities may be realized as functions of a program stored in a non-transitory computer readable recording medium. Examples of a non-transitory computer readable recording medium include, but are not limited to, an external/removable or internal/built-in storage or memory unit, e.g., one or more of an optical disk, such as a DVD, a magnetic disk, such as a hard disk, and a semiconductor memory, such as a ROM, a RAM, or a memory card.

Accordingly, due to the dual-sided wafer imaging apparatus 100 and the dual-sided wafer imaging and inspection methods 300 and 400 of the present disclosure, errors and costs due to human inspection can be reduced significantly. Moreover, non-occluded backside wafer images can be obtained by automated processes with great accuracy. The dual-sided wafer imaging apparatus 100 and the dual-sided imaging and inspection methods 300 and 400 also allow the defect data to be collected and analyzed quickly by artificial intelligence algorithms when compared to human inspection.

One aspect of the present disclosure provides a dual-sided wafer imaging apparatus, including one or more load ports, one or more mechanical arms for transporting a wafer, a wafer transfer stage, a first line scan camera mounted below the wafer transfer stage, a second line scan camera mounted above the wafer transfer stage, a first optical lens mounted on the first line scan camera, a second optical lens mounted on the second line scan camera, and two or more line light sources respectively mounted below and above the wafer transfer stage. The one or more load ports are configured for an automated load operation or unload operation of a wafer pod of an automated transport equipment. The wafer transfer stage includes three or more vacuum suction points in contact with a backside of the wafer, and the wafer transfer stage further includes a drive motor producing a linear reciprocating motion for moving the wafer.

Another aspect of the present disclosure provides a method for dual-sided imaging of a wafer, comprising capturing a dual-sided image of the wafer, wherein when the wafer is transferred in an outbound trip by a wafer transfer stage, a first line scan camera and a second line scan camera respectively mounted below and above the wafer transfer stage respectively capture a first backside wafer image and a frontside wafer image of the dual-sided image of the wafer; rotating the wafer by a predetermined angle, wherein when the wafer reaches an end point of the outbound trip, a wafer aligner below the wafer rises along a vertical direction to pick up the wafer, rotate the wafer by the predetermined angle, and return the wafer to the wafer transfer stage; capturing a second backside wafer image, wherein when the wafer is transferred in a return trip by the wafer transfer stage, the first line scan camera below the wafer transfer stage captures the second backside wafer image; and performing an image processing operation, wherein one or more regions occluded by one or more contact points in the first backside wafer image are imaged more clearly by replacing the first backside wafer image with the second backside wafer image.

Another aspect of the present disclosure provides a method for dual-sided defect inspection and classification of a wafer, comprising: capturing a backside wafer image and a frontside wafer image; determining whether a deep learning object detection model is available; when the deep learning object detection model is available, feeding each image to be inspected into the deep learning object detection model and outputting a plurality of output data, wherein each output data comprises a predicted probability, a predicted classification, and a predicted frame position of a defect in the image; filtering out data having a predicted probability lower than a preset threshold value; selecting, by using a non-maximum suppression algorithm, an optimal predicted frame from a plurality of predicted frames having an intersection over union greater than the preset threshold value; calculating a defect characteristic value according to the predicted classification and the predicted frame position; and outputting an inspection result of the frontside wafer image and the backside wafer image.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A dual-sided wafer imaging apparatus, comprising:
   one or more load ports for an automated load operation or unload operation of a wafer pod of an automated transport equipment;
   one or more mechanical arms for transporting a wafer;
   a wafer transfer stage comprising three or more vacuum suction points in contact with a backside of the wafer for retaining the wafer on the wafer transfer stage in a vacuuming manner, the wafer transfer stage further comprising a drive motor producing a linear reciprocating motion for moving the wafer, wherein the mechanical arm is actuated for transporting the wafer from the load port to the wafer transfer stage;
   a first line scan camera mounted below the wafer transfer stage;
   a second line scan camera mounted above the wafer transfer stage;
   a first optical lens mounted on the first line scan camera for capturing a backside wafer image of the wafer;
   a second optical lens mounted on the second line scan camera for capturing a frontside wafer image of the wafer;
   two or more line light sources respectively mounted below and above the wafer transfer stage; and
   a wafer aligner located below the wafer and being actuated to move along a vertical direction for adjusting a position and a rotation angle of the wafer, returning the wafer to an origin point, and reading a label.

2. The dual-sided wafer imaging apparatus of claim 1, wherein the two or more line light sources are aligned with each other and output a yellow light or a white light.

3. The dual-sided wafer imaging apparatus of claim 1, wherein the first line scan camera and the second line scan camera are actuated at the same time for capturing the backside wafer image and the frontside wafer image as a dual-sided image of the wafer at the same time.

4. The dual-sided wafer imaging apparatus of claim 1, further comprising an air injection device comprising a first nozzle aligned with the first optical lens of the first line scan camera, wherein the first nozzle is arranged to generate a first air stream toward the first optical lens for preventing particles from adhering to the first optical lens.

5. The dual-sided wafer imaging apparatus of claim 4, the air injection device further comprising a second nozzle aligned with the second optical lens of the second line scan camera, wherein the second nozzle is arranged to generate a second air stream toward the second optical lens for preventing particles from adhering to the second optical lens.

6. The dual-sided wafer imaging apparatus of claim 5, wherein the first and second nozzles are actuated to generate the first and second air streams toward the first and second optical lenses respectively when the wafer is not being imaged that is the first and second first and second live scan cameras are not in use.

7. A method for dual-sided imaging of a wafer, comprising the steps of:
   retaining the wafer on a wafer transfer stage in a vacuuming manner, wherein the wafer transfer stage has three or more vacuum suction points in contact with a backside of the wafer to suck the wafer on the wafer transfer stage;
   capturing a dual-sided image of the wafer, wherein when the wafer is transferred in an outbound trip by the wafer transfer stage, a first line scan camera and a second line scan camera respectively mounted below and above the wafer transfer stage respectively capture a first backside wafer image and a frontside wafer image of the dual-sided image of the wafer;
   rotating the wafer by a predetermined angle, wherein when the wafer reaches an end point of the outbound trip, a wafer aligner located below the wafer is actuated to move along a vertical direction to pick up the wafer, rotate the wafer by the predetermined angle, and return the wafer to the wafer transfer stage;
   capturing a second backside wafer image, wherein when the wafer is transferred in a return trip by the wafer transfer stage, the first line scan camera below the wafer transfer stage captures the second backside wafer image; and
   performing an image processing operation, wherein one or more regions occluded by one or more contact points in the first backside wafer image are imaged more clearly by replacing the first backside wafer image with the second backside wafer image.

8. The method of claim 7, wherein two or more line light sources are respectively mounted below and above the wafer transfer stage and are aligned with each other, wherein the two or more line light sources output a yellow light or a white light.

9. The method of claim 7, further comprising a step of via a first nozzle, generating a first air stream toward the first optical lens for preventing particles from adhering to the first optical lens, wherein the first nozzle is aligned with the first optical lens of the first line scan camera.

10. The method of claim 9, further comprising a step of via a second nozzle, generating a second air stream toward the second optical lens for preventing particles from adhering to the second optical lens, wherein the second nozzle is aligned with the second optical lens of the second line scan camera.

11. The method of claim 10, wherein the first and second nozzles are actuated to generate the first and second air streams toward the first and second optical lenses respectively when the wafer is not being imaged that is the first and second first and second live scan cameras are not in use.

12. A method for dual-sided defect inspection and classification of a wafer, comprising the steps of:
via a first line scan camera and a second line scan camera, capturing a backside wafer image and a frontside wafer image as a dual-sided image of the wafer on a wafer transfer stage, wherein a first optical lens of the first line scan camera and a second optical lens of the second line scan camera are mounted below and above the wafer transfer stage for capturing the backside wafer image and the frontside wafer image respectively;
determining whether a deep learning object detection model is available;
when the deep learning object detection model is available, feeding each of the backside wafer image and the frontside wafer image to be inspected into the deep learning object detection model and outputting a plurality of output data, wherein each output data comprises a predicted probability, a predicted classification, and a predicted frame position of a defect in the image;
filtering out data having a predicted probability lower than a preset threshold value;
selecting, by using a non-maximum suppression algorithm, an optimal predicted frame from a plurality of predicted frames having an intersection over union greater than the preset threshold value;
calculating a defect characteristic value according to the predicted classification and the predicted frame position; and
outputting an inspection result of the frontside wafer image and the backside wafer image.

13. The method of claim 12, further comprising the steps of:
when the deep learning object detection model is not available, labeling a plurality of wafer images as a training data and marking a position and a classification of each defect in the wafer images, wherein the defect position is represented by a square frame surrounding the defect, and image coordinates of the upper left and bottom right vertices of the square frame are recorded; and
training the deep learning object detection model, wherein a predetermined quantity of the training data is used to train the deep learning object detection model.

14. The method of claim 12, wherein two or more line light sources are respectively mounted below and above the wafer transfer stage to align with each other, and the two or more line light sources output a yellow light or a white light.

15. The method of claim 14, before the step of capturing the backside wafer image and the frontside wafer image, further comprising a step of via a first nozzle, generating a first air stream toward the first optical lens for preventing particles from adhering to the first optical lens, wherein the first nozzle is aligned with the first optical lens of the first line scan camera.

16. The method of claim 15, before the step of capturing the backside wafer image and the frontside wafer image, further comprising a step of via a second nozzle, generating a second air stream toward the second optical lens for preventing particles from adhering to the second optical lens, wherein the second nozzle is aligned with second first optical lens of the first line scan camera.

17. The method of claim 16, wherein the first and second nozzles are actuated to generate the first and second air streams toward the first and second optical lenses respectively when the wafer is not being imaged that is the first and second first and second live scan cameras are not in use.

* * * * *